(12) United States Patent
Saito et al.

(10) Patent No.: US 9,871,060 B2
(45) Date of Patent: Jan. 16, 2018

(54) SEMICONDUCTOR LIGHT EMITTING DEVICE

(71) Applicant: Kabushiki Kaisha Toshiba, Minato-ku (JP)

(72) Inventors: Nobuyoshi Saito, Ota (JP); Tomio Ono, Yokohama (JP); Shigeya Kimura, Yokohama (JP); Jumpei Tajima, Mitaka (JP); Kentaro Miura, Kawasaki (JP); Shintaro Nakano, Kawasaki (JP); Yuya Maeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/019,091

(22) Filed: Feb. 9, 2016

(65) Prior Publication Data

US 2016/0240561 A1  Aug. 18, 2016

(30) Foreign Application Priority Data

Feb. 16, 2015 (JP) ................................ 2015-027956
Dec. 8, 2015 (JP) ................................ 2015-239298

(51) Int. Cl.
*H01L 27/12* (2006.01)
*H01L 33/62* (2010.01)
(Continued)

(52) U.S. Cl.
CPC ........ *H01L 27/1225* (2013.01); *H01L 27/156* (2013.01); *H01L 33/62* (2013.01); *G02F 1/1362* (2013.01)

(58) Field of Classification Search
None
See application file for complete search history.

(56) References Cited

U.S. PATENT DOCUMENTS 8,441,018 B2    5/2013 Lee et al.
9,224,755 B2 *  12/2015 Bedell ................. H01L 27/1218
(Continued)

FOREIGN PATENT DOCUMENTS

JP    2007-226246    9/2007
JP    2009-71220     4/2009
(Continued)

OTHER PUBLICATIONS

Jacob Day et al. "Ill-Nitride Full-Scale High-Resolution Microdisplays", Applied Physics Letters, vol. 99, 2011, 3 pages.
(Continued)

*Primary Examiner* — Ali Naraghi
(74) *Attorney, Agent, or Firm* — Oblon, McClelland, Maier & Neustadt, L.L.P.

(57) ABSTRACT

According to one embodiment, a semiconductor light emitting device includes a first semiconductor layer of a first conductivity type, a second semiconductor layer of a second conductivity type, a third semiconductor layer. The third semiconductor is provided between the first semiconductor layer and the second semiconductor layer. A first transistor includes a first gate electrode and a first amorphous semiconductor layer. The first gate electrode and the first amorphous semiconductor layer overlap in a first direction. The first direction is from the first semiconductor layer toward the second semiconductor layer. The first gate electrode is provided between the second semiconductor layer and the first amorphous semiconductor layer.

20 Claims, 8 Drawing Sheets

(51) Int. Cl.
*H01L 27/15* (2006.01)
*G02F 1/1362* (2006.01)

(56) References Cited

U.S. PATENT DOCUMENTS

| | | |
|---|---|---|
| 2007/0195044 A1 | 8/2007 | Uemoto |
| 2009/0072267 A1 | 3/2009 | Goshonoo et al. |
| 2012/0094403 A1* | 4/2012 | Nagai ............... H01L 29/66765 |
| | | 438/16 |
| 2015/0144974 A1* | 5/2015 | Chen ..................... H01L 27/15 |
| | | 257/93 |
| 2015/0179812 A1* | 6/2015 | Suzumura ........... H01L 29/7869 |
| | | 257/43 |

FOREIGN PATENT DOCUMENTS

| | | |
|---|---|---|
| JP | 2013-37139 | 2/2013 |
| JP | 2014-99663 | 5/2014 |

OTHER PUBLICATIONS

H.W. Choi et al. "High-Resolution 128 x 96 Nitride Microdisplay", IEEE Electron Device Letters, vol. 25, No. 5, May 2004, 3 pages.

* cited by examiner

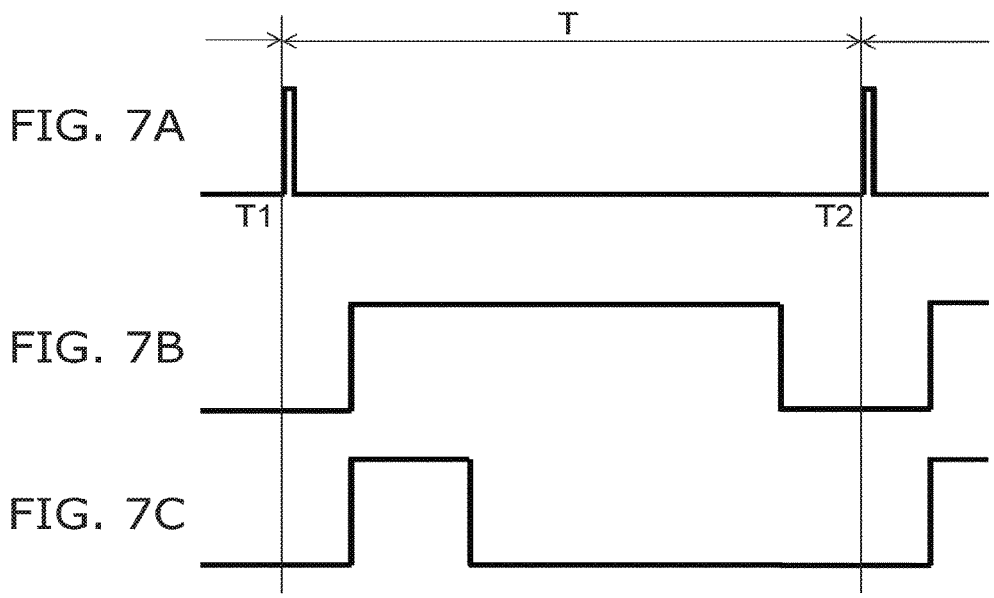
FIG. 7A
FIG. 7B
FIG. 7C
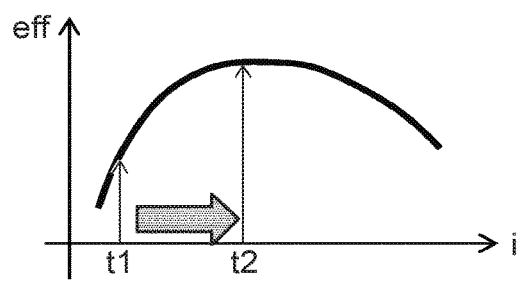
FIG. 8

SEMICONDUCTOR LIGHT EMITTING DEVICE

CROSS-REFERENCE TO RELATED APPLICATIONS

This application is based upon and claims the benefit of priority from Japanese Patent Applications No. 2015-027956, filed on Feb. 16, 2015 and No. 2015-239298, filed on Dec. 8, 2015; the entire contents of which are incorporated herein by reference.

FIELD

Embodiments described herein relate generally to a semiconductor light emitting device.

BACKGROUND

In recent years, the market is growing for microdisplays for projector applications such as head mounted displays, head-up displays, AR (Augmented Reality) glass, projectors, etc. Semiconductor devices are being developed to improve the performance of microdisplays. There is an active matrix-driven semiconductor light emitting device in which LEDs (Light Emitting Diodes) are arranged in an array with thin film transistors (TFTs). High definition is desirable for such a semiconductor light emitting device.

BRIEF DESCRIPTION OF THE DRAWINGS

FIG. 7A to FIG. 7C are timing charts showing the light emission time control according to the third embodiment;

FIG. 8 is a graph of a characteristic of the semiconductor light emitting device according to the third embodiment;

DETAILED DESCRIPTION

Figure 1:
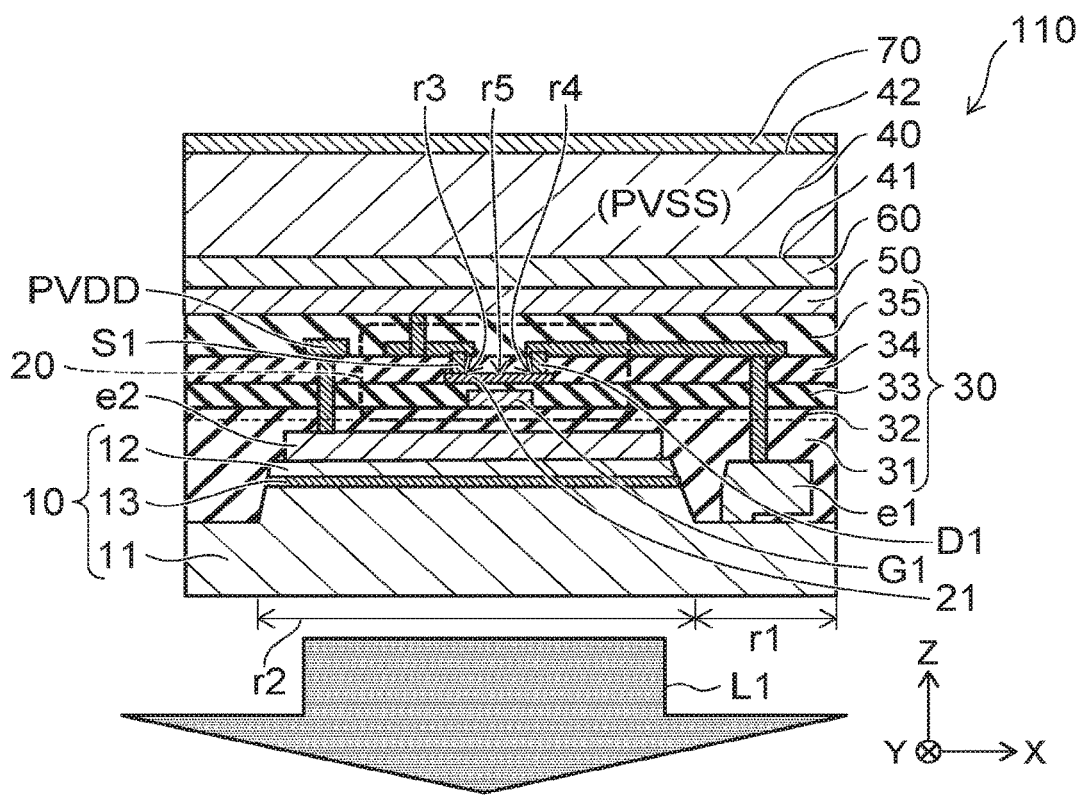
FIG. 1 is a schematic cross-sectional view showing a semiconductor light emitting device according to a first embodiment.

According to one embodiment, a semiconductor light emitting device includes a first semiconductor layer of a first conductivity type, a second semiconductor layer of a second conductivity type, a third semiconductor layer. The third semiconductor is provided between the first semiconductor layer and the second semiconductor layer. A first transistor includes a first gate electrode and a first amorphous semiconductor layer. The first gate electrode and the first amorphous semiconductor layer overlap in a first direction. The first direction is from the first semiconductor layer toward the second semiconductor layer. The first gate electrode is provided between the second semiconductor layer and the first amorphous semiconductor layer.

According to another embodiment, a semiconductor light emitting device includes a first semiconductor layer of a first conductivity type, a second semiconductor layer of a second conductivity type, a third semiconductor layer. The third semiconductor is provided between the first semiconductor layer and the second semiconductor layer. A first transistor includes a first gate electrode and a first amorphous semiconductor layer. The first gate electrode and the first amorphous semiconductor layer overlap in a first direction. The first direction is from the first semiconductor layer toward the second semiconductor layer. The first amorphous semiconductor layer is provided between the second semiconductor layer and the first gate electrode.

Various embodiments of the invention will be described hereinafter with reference to the accompanying drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing a semiconductor light emitting device according to a first embodiment.

As shown in FIG. 1, the semiconductor light emitting device 110 according to the embodiment includes a first light emitting region 10 and a first transistor 20.

The first light emitting region 10 includes a first semiconductor layer 11, a second semiconductor layer 12, and a third semiconductor layer 13. The first semiconductor layer 11 is of a first conductivity type. The second semiconductor layer 12 is of a second conductivity type. The third semiconductor layer 13 is a light emitting layer. The third semiconductor layer 13 is provided between the first semiconductor layer 11 and the second semiconductor layer 12. The third semiconductor layer 13 emits light L1.

The first conductivity type is, for example, an n-type. The second conductivity type is, for example, a p-type. The first conductivity type may be the p-type; and the second conductivity type may be the n-type. The case where the first conductivity type is the n-type and the second conductivity type is the p-type is illustrated in the embodiment.

The first transistor 20 is, for example, a TFT (thin film transistor). The first transistor 20 includes a first gate electrode G1, a first source electrode S1, a first drain electrode D1, and a first amorphous semiconductor layer 21. The first amorphous semiconductor layer 21 includes, for example, an oxide semiconductor. In this case, the first amorphous semiconductor layer 21 is of the first conductivity type (the n-type). The amorphous semiconductor is, for example, a semiconductor having an amorphous state in which the grain size is 10 nanometers (nm) or less. The uniformity of the characteristics of the TFT is superior for the amorphous semiconductor because, unlike a polycrystalline semiconductor, the amorphous semiconductor does not have distinct crystal grain boundaries.

In the embodiment, the first amorphous semiconductor layer 21 and the first gate electrode G1 overlap in the first direction. The first gate electrode G1 is provided on the second semiconductor layer 12 in a first direction. The first direction is, for example, a Z-axis direction. The Z-axis direction is a direction (the stacking direction) from the first semiconductor layer 11 toward the second semiconductor layer 12. One direction orthogonal to the Z-axis direction is taken as an X-axis direction. One direction orthogonal to the Z-axis direction and the X-axis direction is taken as a Y-axis direction. A second direction intersects the first direction. The second direction is, for example, the X-axis direction. "Overlapping" refers to the state in which at least portions overlap when projected onto a plane orthogonal to the Z-axis direction. Being "provided on" includes not only the state of being provided in direct contact but also the state of being provided with a member interposed therebetween.

The semiconductor light emitting device 110 further includes a support substrate (a first layer) 40, a first electrode e1, and a second electrode e2. The support substrate 40 is, for example, conductive. The first electrode e1 is, for example, an n-electrode. The second electrode e2 is, for example, a p-electrode.

The first semiconductor layer 11 includes a first region r1 and a second region r2. The second region r2 is arranged with the first region r1 in the X-axis direction. The second semiconductor layer 12 is provided between the second region r2 and the support substrate 40. The third semiconductor layer 13 is provided between the second region r2 and the second semiconductor layer 12.

The first electrode e1 is provided between the first region r1 and the support substrate 40. The first electrode e1 is electrically connected to the first region r1. The second electrode e2 is electrically connected to the second semiconductor layer 12. The state of being electrically connected includes not only the state of being in direct contact but also the state in which another conductive member or the like is interposed therebetween.

The first light emitting region 10, the first electrode e1, and the second electrode e2 correspond to an LED.

There is a reference example of a semiconductor light emitting device in which an LED and a TFT are arranged in the X-axis direction. For such an arrangement, in the case where the pixel size is reduced to provide high definition, a sufficient aperture ratio cannot be ensured; and the luminance undesirably decreases. Here, the "aperture ratio" means the ratio of the light emitting region (the LED) to the pixel region per pixel. That is, the region where the TFT is disposed is used as a non-light emitting region. Therefore, the aperture ratio decreases.

Conversely, in the embodiment, the TFT is disposed on the LED in the Z-axis direction. In other words, the LED and the TFT overlap in the Z-axis direction. Therefore, a sufficient aperture ratio can be ensured even in the case where high definition is provided. Thereby, the luminance can be increased.

Moreover, in the reference example recited above, polycrystalline silicon (polysilicon) is used as the semiconductor layer of the TFT. Compared to an amorphous semiconductor layer, the grain size of polycrystalline silicon is large; and it is difficult to ensure the uniformity of the TFT characteristics. In particular, the effect of the fluctuation of the characteristics is more severe in the case where high definition pixels are provided and the size of the semiconductor layer of the TFT is small.

Conversely, in the embodiment, an amorphous semiconductor layer is used as the semiconductor layer of the TFT. Therefore, compared to polycrystalline silicon, the uniformity of the TFT characteristics can be increased. Even in the case where high definition pixels are provided, uniform display performance can be obtained.

The semiconductor light emitting device 110 further includes an insulating layer 30, a protective metal layer (a barrier metal) 50, a bonding metal layer (a bonding metal) 60, and a back surface electrode 70.

The insulating layer 30 includes a planarization layer 31, an undercoat layer 32, a gate insulation layer 33, an etching protection layer 34, and a passivation layer 35. The planarization layer 31 is provided on the first electrode e1 and on the second electrode e2. The undercoat layer 32 is provided on the planarization layer 31. The gate insulation layer 33 is provided on the undercoat layer 32 and on the first gate electrode G1. The etching protection layer 34 is provided on the gate insulation layer 33 and on the first amorphous semiconductor layer 21. The passivation layer 35 is provided on the etching protection layer 34.

The barrier metal 50 is provided between the passivation layer 35 and the bonding metal 60. The barrier metal 50 is provided on the passivation layer 35. For example, the barrier metal 50 contacts the passivation layer 35.

The bonding metal 60 is provided between the barrier metal 50 and the support substrate 40. The bonding metal 60 is provided on the barrier metal 50. For example, the bonding metal 60 contacts the barrier metal 50.

The support substrate 40 is provided on the bonding metal 60. The support substrate 40 has a first surface 41, and a second surface 42 provided on the side opposite to the first surface 41. The first surface 41 is electrically connected to the bonding metal 60. For example, the first surface 41 contacts the bonding metal 60. The second surface 42 is electrically connected to the back surface electrode 70. For example, the second surface 42 contacts the back surface electrode 70.

In other words, the barrier metal 50 is provided on the first transistor 20 with the insulating layer 30 interposed. The bonding metal 60 is provided on the barrier metal 50. The support substrate 40 is provided on the bonding metal 60. The back surface electrode 70 is provided on the support substrate 40.

A specific example of the semiconductor light emitting device 110 according to the embodiment will now be described.

The first semiconductor layer 11, the second semiconductor layer 12, and the third semiconductor layer 13 include, for example, nitride semiconductors.

The first electrode e1 includes a material that can obtain good contact with the first semiconductor layer 11. For example, a stacked film of Al/Ni/Au is used as the first electrode e1. The stacked film is stacked in the order of Al/Ni/Au from the first semiconductor layer 11 side. The thickness of the stacked film is, for example, not less than 250 nm and not more than 350 nm.

The second electrode e2 includes a material that can efficiently reflect the light emitted from the third semiconductor layer 13. For example, a stacked film of Ag/Pt is used as the second electrode e2. The stacked film is stacked in the order of Ag/Pt from the second semiconductor layer 12 side. The thickness of the stacked film is, for example, not less than 150 nm and not more than 250 nm.

The first transistor 20 (the TFT) is provided on the second electrode e2.

The planarization layer 31 and the undercoat layer 32 are provided on the second electrode e2. The planarization layer 31 and the undercoat layer 32 each include, for example, at least one of silicon oxide, silicon nitride, silicon oxynitride, aluminum oxide, or a stacked film of these substances.

It is favorable for the first amorphous semiconductor layer 21 to include an oxide semiconductor. By using an oxide semiconductor, the TFT can be formed at a relatively low temperature. For example, the maximum process temperature can be 400° C. or less (favorably 300° C. or less). Thereby, the performance degradation of the LED due to the TFT manufacturing processes can be suppressed. For example, the decrease of the reflectance due to the oxidization of the second electrode e2 which is a reflecting electrode including Ag can be suppressed.

In the case where the first amorphous semiconductor layer 21 includes the oxide semiconductor, for example, it is favorable for aluminum oxide to be used as the undercoat layer 32. The aluminum oxide functions as a hydrogen barrier film. That is, the penetration of hydrogen from the oxide semiconductor of the first amorphous semiconductor layer 21 into the nitride semiconductor layer (e.g., the p-GaN layer) of the first light emitting region 10 can be suppressed. When the hydrogen penetrates the nitride semiconductor layer, a resistance increase is caused by the acceptor (Mg) deactivating. By using the hydrogen barrier film of aluminum oxide, etc., such a resistance increase can be suppressed effectively. Thereby, the performance degradation of the LED can be suppressed.

The first gate electrode G1 is provided on the undercoat layer 32. For example, DC magnetron sputtering is used to form the first gate electrode G1. In such a case, the formation is implemented in an Ar atmosphere. The first gate electrode G1 includes, for example, W, Mo, Ta, Ti, Al, AlNd, Cu, ITO, IZO, etc. DC reactive magnetron sputtering may be used to form the first gate electrode G1.

The gate insulation layer 33 is provided on the first gate electrode G1. The gate insulation layer 33 may include, for example, at least one of silicon oxide, silicon nitride, silicon oxynitride, aluminum oxide, or a stacked film of these substances.

The first amorphous semiconductor layer 21 is provided on the gate insulation layer 33. For example, DC reactive magnetron sputtering is used to form the first amorphous semiconductor layer 21. It is favorable for the first amorphous semiconductor layer 21 to include an oxide of at least one of In, Ga, or Zn. The first amorphous semiconductor layer 21 includes, for example, InGaZnO (IGZO). The first amorphous semiconductor layer 21 may include InZnO, InGaO, InSnZnO, InSnGaZnO, or InSnO.

The etching protection layer 34 is provided on the first amorphous semiconductor layer 21. Heat treatment of the first amorphous semiconductor layer 21 on which the etching protection layer 34 is provided is performed at about 200° C. to 500° C. The etching protection layer 34 includes, for example, at least one of silicon oxide, silicon nitride, silicon oxynitride, aluminum oxide, or a stacked structure of these substances. An inert atmosphere of nitrogen or the like, a mixed atmosphere containing the inert atmosphere and oxygen, hydrogen, water vapor, etc., may be used as the atmosphere of the heat treatment.

The first source electrode S1 and the first drain electrode D1 are provided by making openings in portions of the etching protection layer 34 and the gate insulation layer 33. The first source electrode S1 and the first drain electrode D1 include, for example, one of Ti, Mo, Al, Cu, Ta, W, TiN, TaN, MoN, ITO, IZO, or InGaZnO. The first source electrode S1 and the first drain electrode D1 may include alloys of these materials or stacked structures of films of these materials.

The first transistor 20 is electrically connected to the second electrode e2. Thus, the first transistor 20 is provided at the upper portion of the second electrode e2. Thereby, the function of the pixel circuit can be provided without reducing the aperture ratio. Thereby, high definition is possible.

Then, the passivation layer 35 is provided on the first transistor 20. The passivation layer 35 may include, for example, at least one of silicon oxide, silicon nitride, silicon oxynitride, aluminum oxide, or a stacked structure of these substances.

It is favorable to suppress the penetration of the hydrogen into the nitride semiconductor layer (the p-GaN layer) of the first light emitting region 10. Therefore, the hydrogen atom concentration of the first amorphous semiconductor layer 21 is not less than $10^{18}$ atoms/cm$^3$ and not more than $10^{22}$ atoms/cm$^3$, and more favorably $10^{20}$ atoms/cm$^3$ or less. Thereby, by using the first amorphous semiconductor layer 21 with the hydrogen barrier film described above, the performance degradation of the LED can be suppressed.

In the manufacturing processes of the first transistor 20, for example, planarization may be implemented prior to forming the first amorphous semiconductor layer 21. For example, chemical mechanical polishing, reflow using a coated insulating film (e.g., Spin On Glass (SOG)), BPSG (Boron Phosphorus Silicon Glass), PSG (Phosphorus Silicon Glass), etc., may be utilized as the planarization method. A structure of the first transistor 20 is described in the example in which the first amorphous semiconductor layer 21 is disposed between the first gate electrode G1 and the support substrate 40. The structure of the first transistor 20 may be a structure in which the first gate electrode G1 is disposed between the first amorphous semiconductor layer 21 and the support substrate 40.

In the example, the semiconductor light emitting device 110 includes the support substrate 40 that is electrically connected to the first transistor 20. Specifically, the barrier metal 50 and the bonding metal 60 are provided on the passivation layer 35. The bonding metal 60 includes a material that can obtain a good connection to the support substrate 40. For example, a stacked film of Ti/Au is used as the bonding metal 60. The stacked film is stacked in the order of Ti/Au from the passivation layer 35 side. The thickness of the stacked film is, for example, not less than 750 nm and not more than 850 nm.

The support substrate 40 is bonded to the bonding metal 60. The support substrate 40 includes at least a material that is conductive. The material of the support substrate 40 is not particularly limited. The support substrate 40 includes, for example, a semiconductor substrate of Si, Ge, or the like, a metal plate or a thick film plating layer of CuW, Cu, or the like, etc. It is unnecessary for the entire substrate to be conductive; and a resin including a metal interconnect, etc., may be used.

In the embodiment, Si is used as an example of the support substrate 40. For example, the support substrate 40 is bonded to the bonding metal 60 via solder using a AuSu alloy. The back surface electrode 70 is provided on the support substrate 40.

The support substrate 40 has superior heat dissipation and thermal conductivity. Therefore, when a current is provided, the degradation due to the heat generation of the light emitting element and/or the transistor can be suppressed.

For example, the first semiconductor layer 11 is provided on a growth substrate (not shown); the third semiconductor layer 13 is provided on the first semiconductor layer 11; and the second semiconductor layer 12 is provided on the third semiconductor layer 13. For example, the growth substrate is removed after these semiconductor layers are bonded to the support substrate 40. The growth substrate includes sapphire, silicon (Si), etc. For example, metal-organic chemical vapor deposition or the like is used to form the semiconductor layer.

For example, in the case where a sapphire substrate is used as the growth substrate, for example, laser light of the third harmonic (355 nm) or the fourth harmonic (266 nm) of a $YVO_4$ solid-state laser is irradiated on the first light emitting region 10 from the growth substrate (not shown) side. The wavelength of the laser light is shorter than a bandgap wavelength based on the bandgap of the GaN of the GaN buffer layer (e.g., the non-doped GaN buffer layer). In other words, the energy of the laser light is higher than the energy of the bandgap of GaN. The laser light is absorbed efficiently in the region of the GaN buffer layer (the non-doped GaN buffer layer) on the monocrystalline AlN buffer layer side. Thereby, the GaN on the monocrystalline AlN buffer layer side of the GaN buffer layer is decomposed by heat generation. In the case where a Si substrate is used as the growth substrate, it is sufficient to remove the growth substrate not by irradiating laser light but by polishing the growth substrate to some thickness and by removing the remaining Si substrate by etching.

The first amorphous semiconductor layer 21 includes a third region r3, a fourth region r4, and a fifth region r5. The fourth region r4 is arranged with the third region r3 in the X-axis direction. For example, the first source electrode S1 (one end of the first transistor 20) is provided at the third region r3. For example, the first drain electrode D1 (one other end of the first transistor 20) is provided at the fourth region r4. The fifth region r5 is provided between the third region r3 and the fourth region r4. The fifth region r5 and the first gate electrode G1 overlap in the Z-axis direction.

Figure 2:
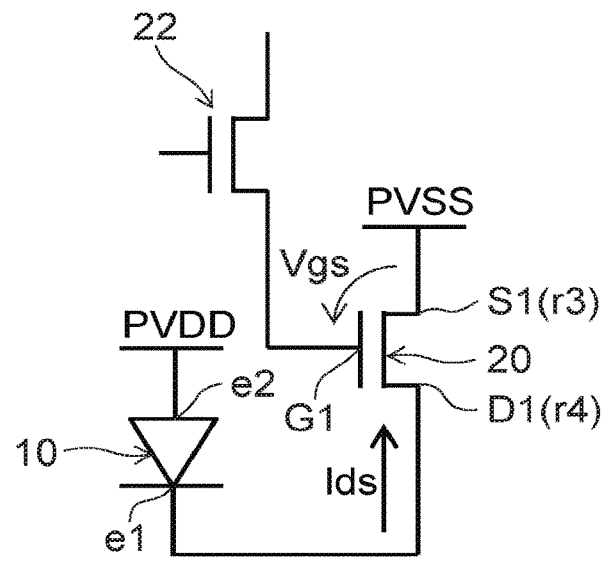
FIG. 2 is an equivalent circuit diagram showing the semiconductor light emitting device according to the first embodiment.

FIG. 2 is an equivalent circuit diagram showing the semiconductor light emitting device according to the first embodiment.

As shown in FIG. 2, the second electrode e2 is electrically connected to a high potential end PVDD. The first electrode e1 is electrically connected to the first drain electrode D1 (the fourth region r4). The first source electrode S1 (the third region r3) is electrically connected to a low potential end PVSS. For example, a conductive support substrate 40 can be used as the low potential end PVSS. For example, the first source electrode S1 is electrically connected to the support substrate 40. In other words, the potential of the support substrate 40 can be utilized as a common potential (a ground potential). Thereby, the potential drop can be suppressed; and a uniform display can be obtained.

Figure 4:
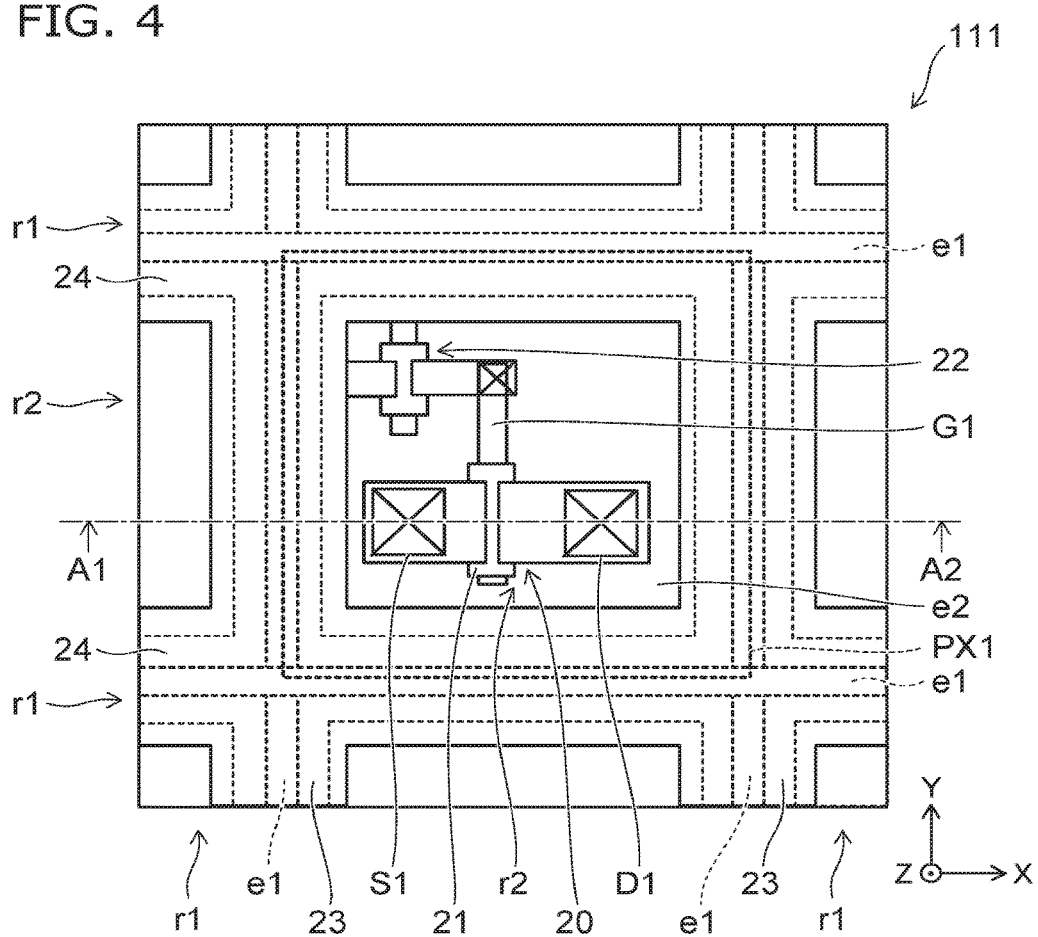
FIG. 4 is a schematic perspective plan view showing a semiconductor light emitting device according to a second embodiment.

The semiconductor light emitting device 110 may further include a second transistor 22 (referring to FIG. 4). The second transistor 22 is electrically connected to the first gate electrode G1. The second transistor 22 is a switching TFT. In other words, the second transistor 22 switches a gate voltage Vgs applied to the first gate electrode G1 ON/OFF and controls a drain current Ids flowing through the first transistor 20. The first transistor 20 is a driving TFT.

Figure 3:
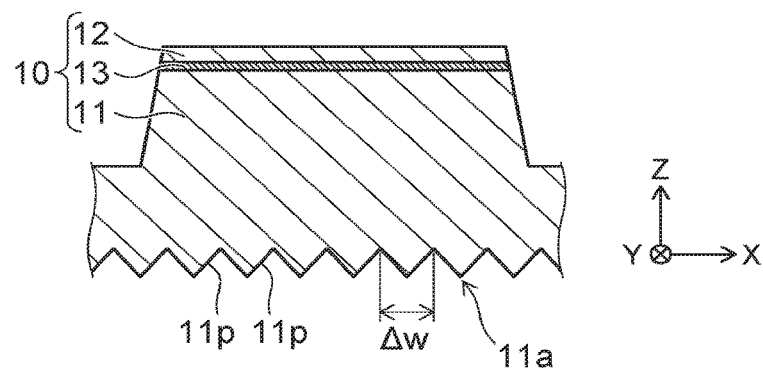
FIG. 3 is a schematic partially-enlarged view showing another semiconductor light emitting device according to the first embodiment.

FIG. 3 is a schematic partially-enlarged view showing another semiconductor light emitting device according to the first embodiment.

In the embodiment, the first semiconductor layer 11 has a major surface 11a provided on the side opposite to the third semiconductor layer 13. Multiple protrusions 11p may be provided in the major surface 11a. For example, a maximum width ΔW along the X-axis direction of the protrusions 11p is longer than the peak wavelength inside the first semiconductor layer 11 of the emitted light radiated from the third semiconductor layer 13. Thereby, the emitted light can be considered to have Lambertian reflectance at the interface between the first semiconductor layer 11 and the outside; and the light extraction efficiency can be increased further. Here, the peak wavelength is the wavelength of the light of the highest intensity of the emitted light radiated from the third semiconductor layer 13. The peak wavelength is a wavelength corresponding to the peak value of the spectral distribution of the emitted light. In the case where the spectrum has two or more non-noise peak values, the wavelength of any of the peak values may be selected.

Thus, according to the embodiment, a sufficient aperture ratio can be ensured even in the case where high definition is provided. Thereby, the luminance can be increased. Thereby, a high definition semiconductor light emitting device can be provided.

Second Embodiment

FIG. 4 is a schematic perspective plan view showing a semiconductor light emitting device according to a second embodiment.

Figure 5:
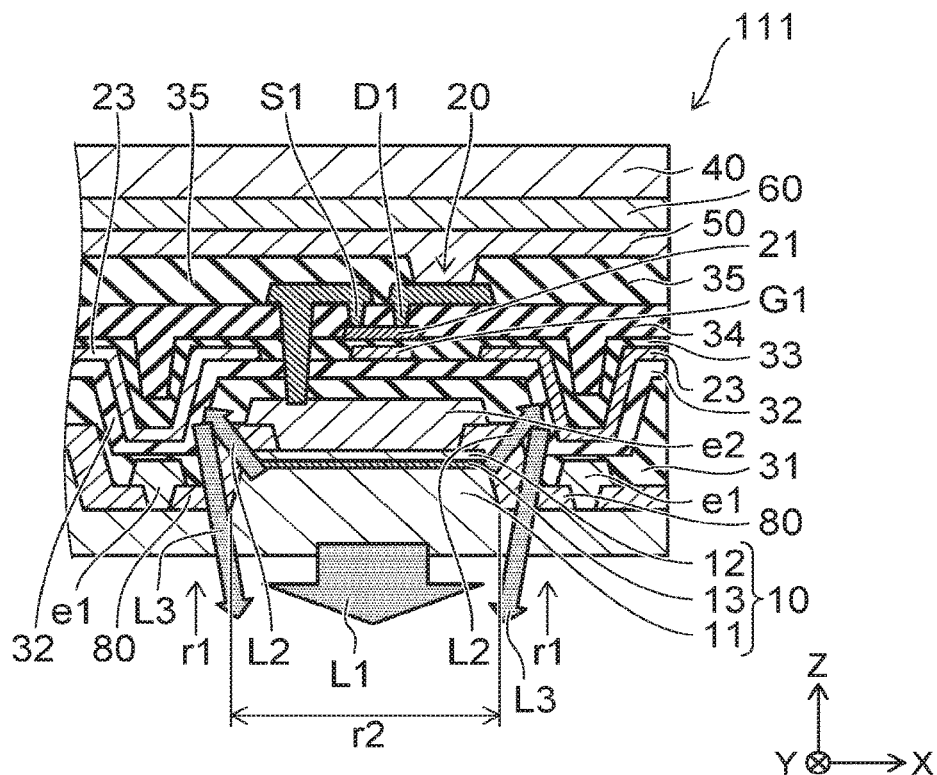
FIG. 5 is a schematic cross-sectional view showing the semiconductor light emitting device according to the second embodiment.

FIG. 5 is a schematic cross-sectional view showing the semiconductor light emitting device according to the second embodiment.

FIG. 5 shows an A1-A2 cross section of FIG. 4.

Some of the components shown in the cross-sectional view of FIG. 5 are not shown in the perspective plan view of FIG. 4 for easier viewing of the drawing.

In the embodiment, the first source electrode S1 is electrically connected to the second electrode e2. The first drain electrode D1 is electrically connected to the support substrate 40 via the barrier metal 50 and the bonding metal 60.

The first region r1 is disposed around the second region r2 when projected onto a plane perpendicular to the Z-axis direction. The first electrode e1 and a portion of the first region r1 overlap in the Z-axis direction. In other words, the first electrode e1 is disposed in a mesh configuration around the second electrode e2. The first electrode e1 is provided around a region corresponding to one pixel Px1. By disposing the first electrode e1 in the mesh configuration, the drop of the common potential of the first transistor 20 can be suppressed.

The semiconductor light emitting device 111 according to the embodiment further includes a region 80, a first interconnect 23, and a second interconnect 24. The first interconnect 23 is, for example, a signal line of the first transistor 20. The second interconnect 24 is, for example, a control line of the first transistor 20. The first interconnect 23 and the second interconnect 24 each include, for example, a metal material that is light-reflective.

The region 80 is provided between the first electrode e1 and the second electrode e2 in the X-axis direction. The region 80 is, for example, an inter-electrode insulating layer of silicon oxide, etc. The first interconnect 23 is provided between the first electrode e1 and the support substrate 40 in the Z-axis direction. The second interconnect 24 is provided between the first electrode e1 and the support substrate 40 in the Z-axis direction. The first interconnect 23 and the second interconnect 24 intersect each other and are provided in a mesh configuration. The first interconnect 23 and the region 80 overlap in the Z-axis direction. The second interconnect 24 and the region 80 overlap in the Z-axis direction.

In other words, in the embodiment, the interconnects of the TFT are disposed between the p-electrode array of the pixel Px1. Thereby, leakage light L2 toward the TFT side is reflected by the first interconnect 23 (and the second interconnect 24) to become reflected light L3. Thereby, the leakage light L2 can be reduced. Thereby, the light degradation and light leakage of the TFT can be suppressed. The light extraction efficiency of the LED in the direction of the emitted light L1 can be increased. Thereby, crosstalk between pixels can be suppressed.

Third Embodiment

Figure 6:
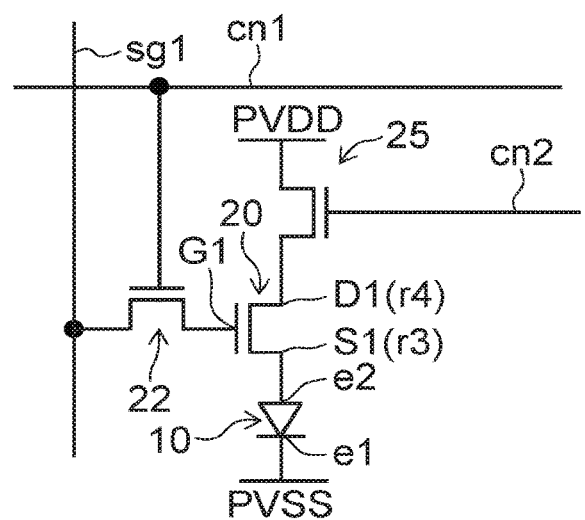
FIG. 6 is an equivalent circuit diagram showing a semiconductor light emitting device according to a third embodiment.

FIG. 6 is an equivalent circuit diagram showing a semiconductor light emitting device according to a third embodiment.

The semiconductor light emitting device 111a according to the embodiment includes the first transistor 20, the second transistor 22, and a third transistor 25. The first transistor 20 is a driving TFT. The second transistor 22 is a switching TFT. The third transistor 25 is a light emission time control (duty control) TFT.

As shown in FIG. 1 described above, the first amorphous semiconductor layer 21 includes the third region r3, the fourth region r4, and the fifth region r5. The fourth region r4 is arranged with the third region r3 in the X-axis direction. For example, the first source electrode S1 (one end of the first transistor 20) is provided at the third region r3. For example, the first drain electrode D1 (one other end of the first transistor 20) is provided at the fourth region r4. The fifth region r5 is provided between the third region r3 and the fourth region r4. The fifth region r5 and the first gate electrode G1 overlap in the Z-axis direction.

In the example, the first gate electrode G1 is electrically connected to the source electrode of the second transistor 22. A control line cn1 is connected to the gate electrode of the second transistor 22; and a signal line sg1 is connected to the drain electrode of the second transistor 22. The third region r3 (the first source electrode S1) is electrically connected to the second electrode e2. The fourth region r4 (the first drain electrode D1) is electrically connected to the third transistor 25. A control line cn2 is connected to the gate electrode of the third transistor 25. The source electrode of the third transistor 25 is connected to the first transistor 20; and the drain electrode of the third transistor 25 is connected to the high potential end PVDD. In the example, the first electrode e1 (the first semiconductor layer 11) side is used as the low potential end PVSS.

FIG. 7A to FIG. 7C are timing charts showing the light emission time control according to the third embodiment.

FIG. 7A is a timing chart of a control line cn1 connected to the second transistor 22.

FIG. 7B is a timing chart of a control line cn2 connected to the third transistor 25 in the case where the current density is such that the external quantum efficiency is high.

FIG. 7C is a timing chart of the control line cn2 connected to the third transistor 25 in the case where the current density is low and the external quantum efficiency decreases because the luminance is low.

In FIG. 7A, T is one period. In the case where the current density is small and the external quantum efficiency decreases, the low luminance is realized with high efficiency by reducing the duty ratio and increasing the current density so that the external quantum efficiency is high as shown in FIG. 7B. To suppress the decrease of the luminous efficiency when the current density is low, the low luminance is realized by the light emission time control.

FIG. 8 is a graph of a characteristic of the semiconductor light emitting device according to the third embodiment.

In the figure, the horizontal axis i is the current density $(A/m^2)$; and the vertical axis eff is the external quantum efficiency (%).

For example, the external quantum efficiency of the LED decreases in the case where the current density is low when the luminance is low, etc. Therefore, the processing of increasing a current density i1 to a current density i2 is implemented and the duty ratio is reduced by using the third transistor 25. Thereby, even when the luminance is low, operations are possible with a current density that provides high efficiency; and the power consumption of the display can be reduced.

Fourth Embodiment

Figure 9:
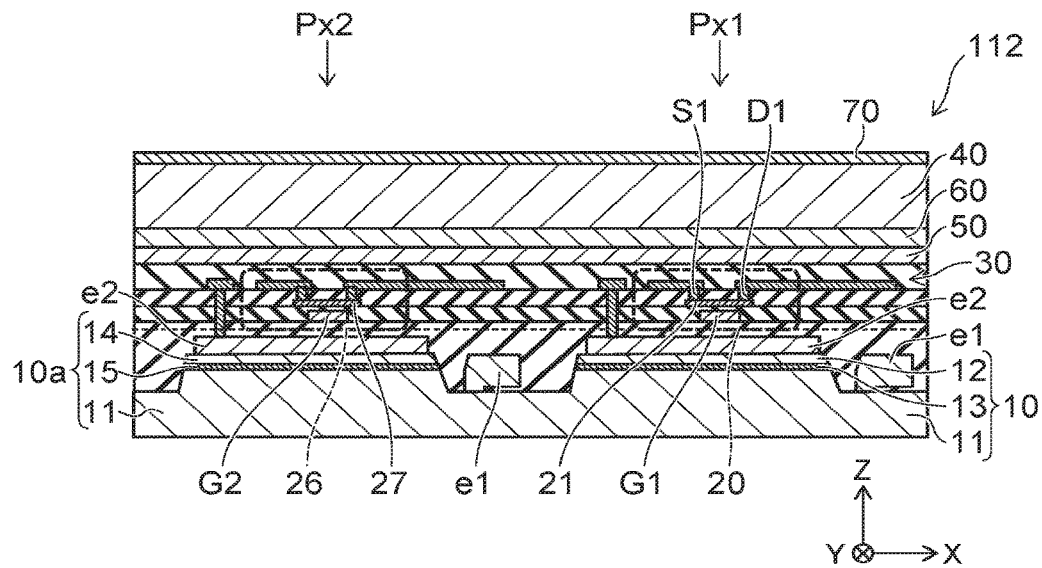
FIG. 9 is a schematic cross-sectional view showing a semiconductor light emitting device according to a fourth embodiment.

FIG. 9 is a schematic cross-sectional view showing a semiconductor light emitting device according to a fourth embodiment.

While the structure of one pixel is illustrated in the embodiment described above, the structure of multiple pixels is illustrated in the embodiment.

The semiconductor light emitting device 112 according to the embodiment includes the first pixel Px1 and a second pixel Px2. The structure of the first pixel Px1 is the same as that of the semiconductor light emitting device 110 shown in FIG. 1. Both the first pixel Px1 and the second pixel Px2 are provided on the first semiconductor layer 11. In other words, the first semiconductor layer 11 is provided to be continuous in the X-axis direction.

The basic structure of the second pixel Px2 is the same as that of the first pixel Px1. The second pixel Px2 includes a second light emitting region 10a and a fourth transistor 26. The second light emitting region 10a includes the first semiconductor layer 11, a fourth semiconductor layer 14, and a fifth semiconductor layer 15. For example, the fourth semiconductor layer 14 is of the second conductivity type (the p-type). The fifth semiconductor layer 15 is provided between the first semiconductor layer 11 and the fourth semiconductor layer 14 and is positioned on the first semiconductor layer 11. The fifth semiconductor layer 15 is a light emitting layer.

The fourth transistor 26 includes a second gate electrode G2 and a second amorphous semiconductor layer 27. The second amorphous semiconductor layer 27 and the second gate electrode G2 overlap in the Z-axis direction. The second gate electrode G2 is provided on the fourth semiconductor layer 14 in the Z-axis direction.

Thus, according to the embodiment, a common semiconductor layer (the first semiconductor layer 11) is used for the multiple pixels. Therefore, the first semiconductor layer can be utilized for the common potential of the TFT. Thereby, high definition is possible; and the decrease of the common potential can be suppressed.

Fifth Embodiment

Figure 10:
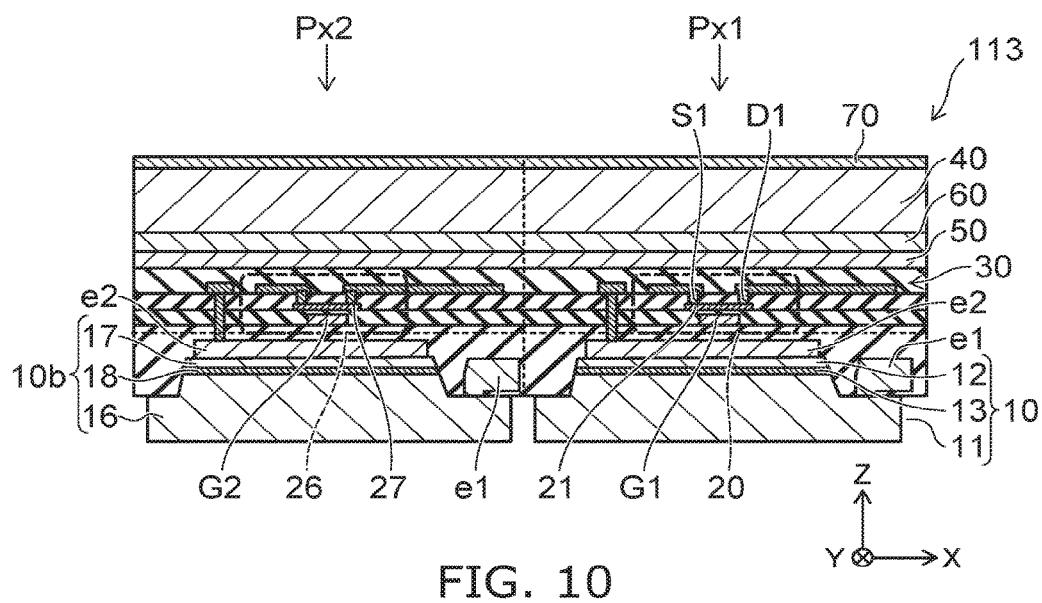
FIG. 10 is a schematic cross-sectional view showing a semiconductor light emitting device according to a fifth embodiment.

FIG. 10 is a schematic cross-sectional view showing a semiconductor light emitting device according to a fifth embodiment.

Although a common semiconductor layer is used for multiple pixels in the fourth embodiment, a semiconductor layer that is divided every pixel is used in the embodiment.

The semiconductor light emitting device 113 according to the embodiment includes the first pixel Px1 and the second pixel Px2. The structure of the first pixel Px1 is the same as that of the semiconductor light emitting device 110 shown in FIG. 1. The first pixel Px1 includes the first gate electrode G1. The first gate electrode G1 is provided on the first semiconductor layer 11. The second pixel Px2 includes the second gate electrode G2. The second gate electrode G2 is provided on a sixth semiconductor layer 16. The sixth semiconductor layer 16 is separated from the first semiconductor layer 11. In other words, the semiconductor layer is provided for the multiple pixels in a state of being divided in the X-axis direction.

The basic structure of the second pixel Px2 is the same as that of the first pixel Px1. The second pixel Px2 includes a third light emitting region 10b and the fourth transistor 26. The third light emitting region 10b includes the sixth semiconductor layer 16, a seventh semiconductor layer 17, and an eighth semiconductor layer 18. For example, the sixth semiconductor layer 16 is of the first conductivity type (the n-type). For example, the seventh semiconductor layer 17 is of the second conductivity type (the p-type). The eighth semiconductor layer 18 is provided between the sixth semiconductor layer 16 and the seventh semiconductor layer 17 and is positioned on the sixth semiconductor layer 16. The eighth semiconductor layer 18 is a light emitting layer.

The fourth transistor 26 includes the second gate electrode G2 and the second amorphous semiconductor layer 27. The second amorphous semiconductor layer 27 and the second gate electrode G2 overlap in the Z-axis direction. The second gate electrode G2 is provided on the seventh semiconductor layer 17 in the Z-axis direction.

Thus, according to the embodiment, the semiconductor layers (the first semiconductor layer 11 and the sixth semiconductor layer 16) are divided for each of the multiple pixels. Thereby, high definition is possible; light leakage to the peripheral pixels of the light emitting pixel can be suppressed; and crosstalk between pixels can be suppressed.

Sixth Embodiment

Figure 11:
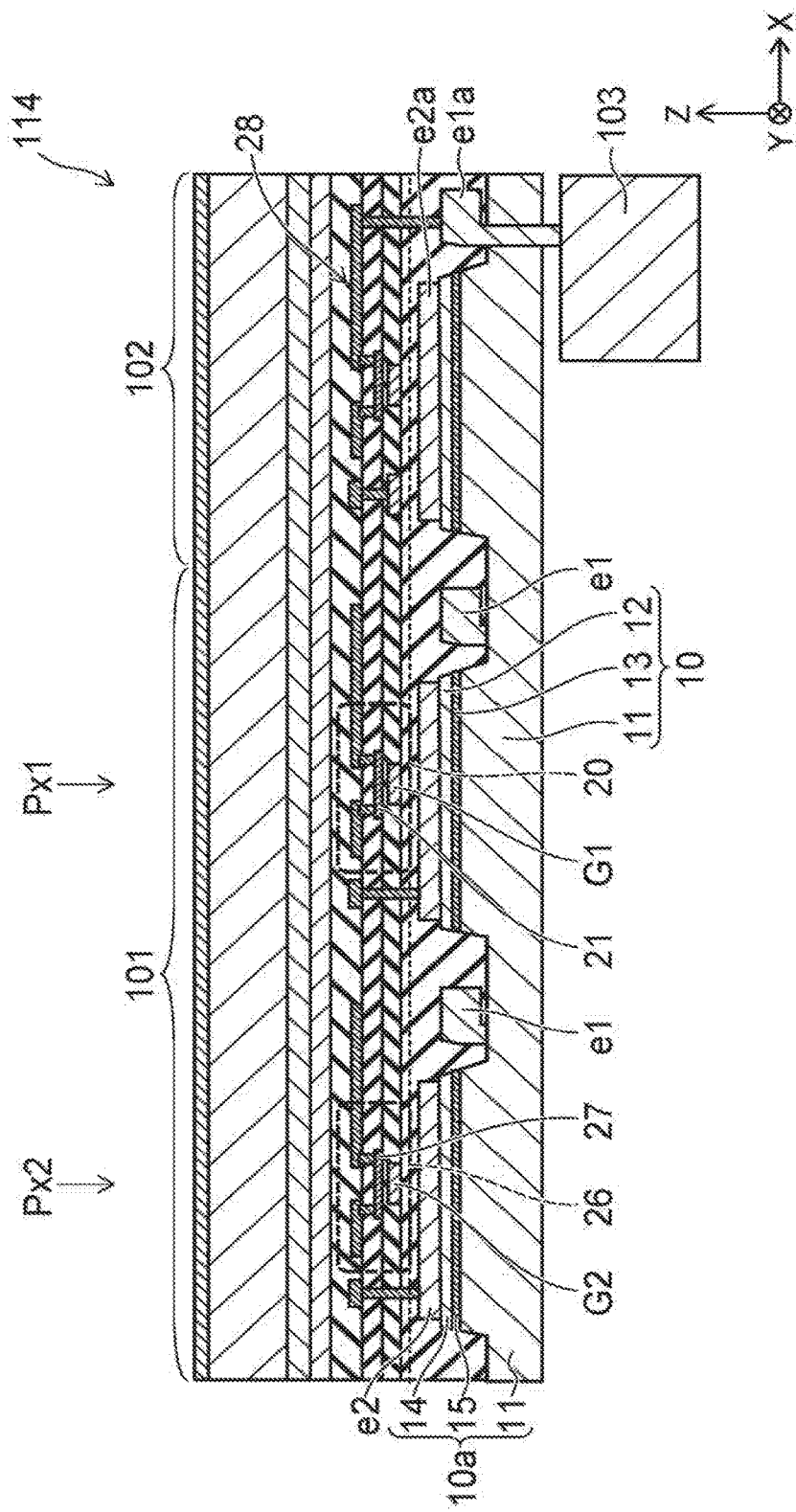
FIG. 11 is a schematic cross-sectional view showing a semiconductor light emitting device according to a sixth embodiment.

FIG. 11 is a schematic cross-sectional view showing a semiconductor light emitting device according to a sixth embodiment.

The semiconductor light emitting device 114 according to the embodiment includes a pixel circuit 101 and a peripheral circuit 102. The pixel circuit 101 includes the first pixel Px1 and the second pixel Px2. The structures of the first pixel Px1 and the second pixel Px2 are the same as those of the structure of FIG. 9.

The peripheral circuit 102 includes a fifth transistor 28 for the peripheral circuit. The fifth transistor 28 is a TFT similar to the other transistors. The fifth transistor 28 is provided on a first electrode e1a and a second electrode e2a. In other words, it is not always necessary to provide electrodes for the peripheral circuit 102. Here, in the embodiment, the light-reflective electrodes remain; and the fifth transistor 28 is provided on the light-reflective electrodes in this state. Thereby, high definition is possible; and light shielding for the TFT (the fifth transistor 28) can be performed.

The first electrode e1a of the peripheral circuit 102 is electrically connected to an IC chip 103 via an interconnect. Thereby, it is possible to use the embodiment as a display.

Seventh Embodiment

Figure 12:
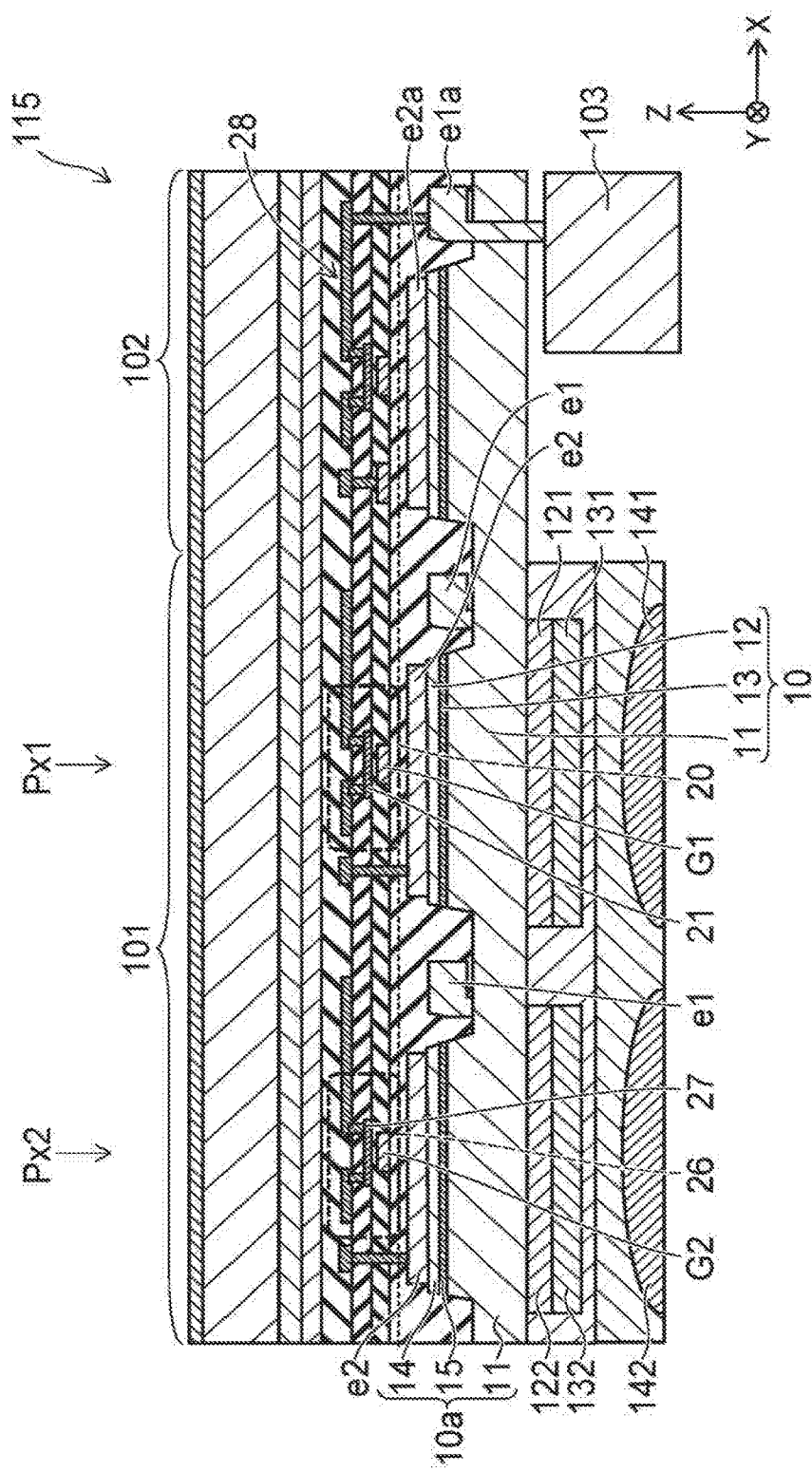
FIG. 12 is a schematic cross-sectional view showing a semiconductor light emitting device according to a seventh embodiment.

FIG. 12 is a schematic cross-sectional view showing a semiconductor light emitting device according to a seventh embodiment.

Similarly to the sixth embodiment, the semiconductor light emitting device 115 according to the embodiment includes the first pixel Px1 and the second pixel Px2. The first pixel Px1 further includes a first fluorescer layer 121; and the second pixel Px2 further includes a second fluorescer layer 122. Colors are realized by these fluorescer layers.

The first semiconductor layer 11 is provided between the third semiconductor layer 13 and the first fluorescer layer 121 and between the fifth semiconductor layer 15 and the second fluorescer layer 122. The average particle size of these fluorescer layers is, for example, 50 µm or less. In the case of high definition pixels, the blurriness of the pixels can be reduced by reducing the particle size and/or film thickness of the fluorescer to be about pixel size. For example, nanoparticle fluorescers or quantum dots may be used. For example, the particle size of such fluorescers is 1 µm or less. These fluorescer layers may be patterned into pixels. For example, a stripe configuration or the like is patterned.

A first color filter 131 is provided on the lower side of the first fluorescer layer 121. A first microlens 141 is provided on the lower side of the first color filter 131. A second color filter 132 is provided on the lower side of the second fluorescer layer 122. A second microlens 142 is provided on the lower side of the second color filter 132.

Thus, according to the embodiment, high definition is possible; and it is possible to utilize the embodiment as a full-color display.

Eighth Embodiment

Figure 13:
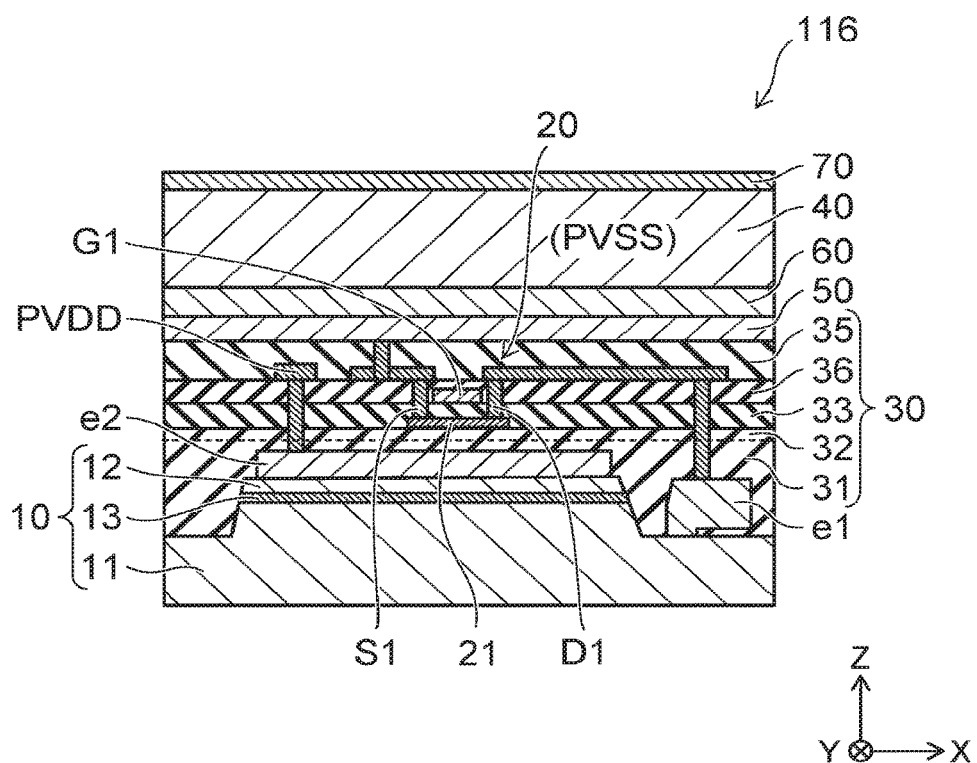
FIG. 13 is a schematic cross-sectional view showing a semiconductor light emitting device according to an eighth embodiment.

FIG. 13 is a schematic cross-sectional view showing a semiconductor light emitting device according to an eighth embodiment.

In the semiconductor light emitting device 116 according to the embodiment, the first gate electrode G1 is disposed between the first amorphous semiconductor layer 21 and the support substrate 40. That is, the first amorphous semiconductor layer 21 may be provided between the second semiconductor layer 12 and the first gate electrode G1. The semiconductor light emitting device 116 includes the insulating layer 30. The insulating layer 30 includes the planarization layer 31, the undercoat layer 32, the gate insulation layer 33, the passivation layer 35 and a gate protection layer 36. The gate protection layer 36 is provided between the gate insulation layer 33 and the passivation layer 35.

According to the embodiments, a high definition semiconductor light emitting device can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor"

further includes group V elements other than N (nitrogen) in the chemical formula recited above, various elements added to control various properties such as the conductivity type and the like, and various elements included unintentionally.

Hereinabove, embodiments of the invention are described with reference to specific examples. However, the invention is not limited to these specific examples. For example, one skilled in the art may similarly practice the invention by appropriately selecting specific configurations of components such as the first semiconductor layer, the second semiconductor layer, the third semiconductor layer, the first transistor, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All semiconductor light emitting devices practicable by an appropriate design modification by one skilled in the art based on the semiconductor light emitting devices described above as embodiments of the invention are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
a first semiconductor layer of a first conductivity type;
a second semiconductor layer of a second conductivity type;
a third semiconductor layer provided between the first semiconductor layer and the second semiconductor layer;
a first transistor including a first gate electrode and a first amorphous semiconductor layer, the first gate electrode and the first amorphous semiconductor layer overlapping in a first direction, the first direction being from the first semiconductor layer toward the second semiconductor layer;
a first layer;
a first electrode; and
a second electrode,
the first gate electrode being provided between the second semiconductor layer and the first amorphous semiconductor layer,
the first semiconductor layer further including a first region and a second region, the second region being arranged with the first region in a second direction intersecting the first direction,
the second semiconductor layer being provided between the second region and the first layer,
the third semiconductor layer being provided between the second region and the second semiconductor layer,
the first electrode being provided between the first region and the first layer and electrically connected to the first region,
the second electrode being provided between the second semiconductor layer and the first layer and electrically connected to the second semiconductor layer.

2. The device according to claim 1, wherein
the first region is disposed around the second region when projected onto a plane perpendicular to the first direction, and
the first electrode and a portion of the first region overlap in the first direction.

3. The device according to claim 1, wherein
the first amorphous semiconductor layer further includes a third region, a fourth region, and a fifth region, one end of the first transistor being provided at the third region, the fourth region being arranged with the third region in the second direction, one other end of the first transistor being provided at the fourth region, the fifth region being provided between the third region and the fourth region, the first gate electrode and the fifth region overlapping in the first direction,
the first layer is conductive and electrically connected to the third region, and
the first electrode is electrically connected to the fourth region.

4. The device according to claim 1, further comprising:
a region provided between the first electrode and the second electrode in the second direction; and
an interconnect provided between the first electrode and the first layer in the first direction,
the interconnect and the region overlapping in the first direction.

5. The device according to claim 1, further comprising:
a second transistor; and
a third transistor,
the first amorphous semiconductor layer further including a third region, a fourth region, and a fifth region, one end of the first transistor being provided at the third region, the fourth region being arranged with the third region in the second direction, one other end of the first transistor being provided at the fourth region, the fifth region being provided between the third region and the fourth region, the first gate electrode and the fifth region overlapping in the first direction,
the first gate electrode being electrically connected to the second transistor,
the third region being electrically connected to the second electrode,
the fourth region being electrically connected to the third transistor.

6. The device according to claim 1, further comprising:
a fourth transistor;
a fourth semiconductor layer of the second conductivity type; and
a fifth semiconductor layer provided between the first semiconductor layer and the fourth semiconductor layer,
the fourth transistor including
a second gate electrode, and
a second amorphous semiconductor layer, the second gate electrode and the second amorphous semiconductor layer overlapping in the first direction,
the second gate electrode being provided between the fourth semiconductor layer and the second amorphous semiconductor layer.

7. The device according to claim 1, further comprising:
a fourth transistor;
a sixth semiconductor layer of the first conductivity type, the sixth semiconductor layer being separated from the first semiconductor layer;
a seventh semiconductor layer of the second conductivity type; and
an eighth semiconductor layer provided between the sixth semiconductor layer and the seventh semiconductor layer,
the fourth transistor including
a second gate electrode, and
a second amorphous semiconductor layer, the second gate electrode and the second amorphous semiconductor layer overlapping in the first direction,
the second gate electrode being provided between the seventh semiconductor layer and the second amorphous semiconductor layer in the first direction.

8. The device according to claim 1, wherein the first semiconductor layer, the second semiconductor layer, and the third semiconductor layer each include a nitride semiconductor.

9. The device according to claim 1, wherein the first electrode includes aluminum, nickel, and gold.

10. The device according to claim 1, wherein the second electrode includes silver and platinum.

11. The device according to claim 1, wherein the first amorphous semiconductor layer includes an oxide of at least one of indium, gallium, or zinc.

12. The device according to claim 1, wherein a hydrogen atom concentration of the first amorphous semiconductor layer is not less than $10^{18}$ atoms/cm$^3$ and not more than $10^{22}$ atoms/cm$^3$.

13. The device according to claim 1, wherein the first semiconductor layer further has a major surface provided on a side opposite to the third semiconductor layer, a plurality of protrusions being provided in the major surface.

14. A semiconductor light emitting device, comprising:
a first semiconductor layer of a first conductivity type:
a second semiconductor layer of a second conductivity type;
a third semiconductor layer provided between the first semiconductor layer and the second semiconductor layer;
a first transistor including a first gate electrode and a first amorphous semiconductor layer, the first gate electrode and the first amorphous semiconductor layer overlapping in a first direction, the first direction being from the first semiconductor layer toward the second semiconductor layer; and
a second transistor,
the second transistor being electrically connected to the first gate electrode.

15. The device according to claim 14, wherein
a first region is disposed around a second region when projected onto a plane perpendicular to the first direction, and
a first electrode and a portion of the first region overlap in the first direction.

16. The device according to claim 14, wherein
the first amorphous semiconductor layer further includes a third region, a fourth region, and a fifth region, one end of the first transistor being provided at the third region, the fourth region being arranged with the third region in the second direction, one other end of the first transistor being provided at the fourth region, the fifth region being provided between the third region and the fourth region, the first gate electrode and the fifth region overlapping in the first direction,
a first layer,
the first layer is conductive and electrically connected to the third region, and
the first electrode is electrically connected to the fourth region.

17. The device according to claim 14, further comprising:
a region provided between a first electrode and a second electrode in the second direction; and
an interconnect provided between the first electrode and a first layer in the first direction,
the interconnect and a region overlapping in the first direction.

18. The device according to claim 14, further comprising:
a third transistor,
the first amorphous semiconductor layer further including
a third region, a fourth region, and a fifth region, one end of the first transistor being provided at the third region, the fourth region being arranged with the third region in the second direction, one other end of the first transistor being provided at the fourth region, the fifth region being provided between the third region and the fourth region, the first gate electrode and the fifth region overlapping in the first direction,
the first gate electrode being electrically connected to the second transistor,
the third region being electrically connected to a second electrode, and
the fourth region being electrically connected to the third transistor.

19. The device according to claim 14, further comprising:
a fourth transistor;
a fourth semiconductor layer of the second conductivity type; and
a fifth semiconductor layer provided between the first semiconductor layer and the fourth semiconductor layer,
the fourth transistor including
a second gate electrode, and
a second amorphous semiconductor layer, the second gate electrode and the second amorphous semiconductor layer overlapping in the first direction,
the second gate electrode being provided between the fourth semiconductor layer and the second amorphous semiconductor layer.

20. The device according to claim 14, further comprising:
a fourth transistor:
a sixth semiconductor layer of the first conductivity type, the sixth semiconductor layer being separated from the first semiconductor layer;
a seventh semiconductor layer of the second conductivity type; and
an eighth semiconductor layer provided between the sixth semiconductor layer and the seventh semiconductor layer,
the fourth transistor including
a second gate electrode, and
a second amorphous semiconductor layer, the second gate electrode and the second amorphous semiconductor layer overlapping in the first direction,
the second gate electrode being provided between the seventh semiconductor layer and the second amorphous semiconductor layer in the first direction.

* * * * *